(12) United States Patent
Sugawara et al.

(10) Patent No.: US 7,662,236 B2
(45) Date of Patent: *Feb. 16, 2010

(54) METHOD FOR FORMING INSULATION FILM

(75) Inventors: Takuya Sugawara, Nirasaki (JP); Yoshihide Tada, Nirasaki (JP); Genji Nakamura, Nirasaki (JP); Shigenori Ozaki, Amagasaki (JP); Toshio Nakanishi, Amagasaki (JP); Masaru Sasaki, Amagasaki (JP); Seiji Matsuyama, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/145,971

(22) Filed: Jun. 25, 2008

(65) Prior Publication Data

US 2008/0274370 A1 Nov. 6, 2008

Related U.S. Application Data

(62) Division of application No. 10/509,370, filed as application No. PCT/JP03/04091 on Mar. 31, 2003, now Pat. No. 7,446,052.

(30) Foreign Application Priority Data

Mar. 29, 2002 (JP) ............................. 2002-097906

(51) Int. Cl.
*B08B 3/12* (2006.01)
*B08B 6/00* (2006.01)
*B08B 7/00* (2006.01)

(52) U.S. Cl. ............................. 134/1; 134/1.1; 134/1.2; 438/758; 438/761

(58) Field of Classification Search ....................... None
See application file for complete search history.

(56) References Cited

U.S. PATENT DOCUMENTS 5,618,382 A 4/1997 Mintz et al.

(Continued)

FOREIGN PATENT DOCUMENTS

JP 57-67009 A 4/1982

(Continued)

OTHER PUBLICATIONS

Form PCT/IB/338 (one (1) page) and Form PCT/IPEA/409 (four (4) pages) for a total of (five (5) pages).

(Continued)

*Primary Examiner*—Duy-Vu N Deo
(74) *Attorney, Agent, or Firm*—Crowell & Moring LLP

(57) ABSTRACT

In a process involving the formation of an insulating film on a substrate for an electronic device, the insulating film is formed on the substrate surface by carrying out two or more steps for regulating the characteristic of the insulating film involved in the process under the same operation principle. The formation of an insulating film having a high level of cleanness can be realized by carrying out treatment such as cleaning, oxidation, nitriding, and a film thickness reduction while avoiding exposure to the air. Further, carrying out various steps regarding the formation of an insulating film under the same operation principle can realize simplification of the form of an apparatus and can form an insulating film having excellent property with a high efficiency.

8 Claims, 13 Drawing Sheets

U.S. PATENT DOCUMENTS

| | | |
|---|---|---|
| 5,685,949 A | 11/1997 | Yashima |
| 6,357,385 B1 | 3/2002 | Ohmi et al. |
| 6,451,641 B1 | 9/2002 | Halliyal et al. |
| 6,689,284 B1 | 2/2004 | Nakasaki |
| 7,446,052 B2 * | 11/2008 | Sugawara et al. ............ 438/758 |
| 2001/0023120 A1 | 9/2001 | Tsunashima et al. |
| 2002/0001906 A1 | 1/2002 | Park |
| 2002/0009892 A1 | 1/2002 | Cohen et al. |
| 2002/0014666 A1 | 2/2002 | Ohmi et al. |

FOREIGN PATENT DOCUMENTS

| | | |
|---|---|---|
| JP | 63-170927 A | 7/1988 |
| JP | 11-40397 A | 2/1999 |
| JP | 2000-294550 A | 10/2000 |
| JP | 2001-111000 A | 4/2001 |
| JP | 2001-160555 A | 6/2001 |
| JP | 2001-168076 A | 6/2001 |
| JP | 2001-217415 A | 8/2001 |
| JP | 2001-257344 A | 9/2001 |
| JP | 2002-26319 A | 1/2002 |

OTHER PUBLICATIONS

International Search Report dated Jun. 17, 2003 (two (2) pages).
Notice of Reasons for Rejection (in Japanese) Jun. 20, 2006 (two (2) pages).
Decision of Final Rejection (in Japanese) dated Sep. 19, 2006 (two (2) pages).
Notice of Reasons for Rejection in pretrial examination (in Japanese) dated Apr. 24, 2007 (two (2) pages).
Wolf, "Silicon Processing for the VLSI Era", 2002, Lattice Press, vol. 4, pp. 145-146.
Rossnagel et al., "Handbook of Plasma Processing", 1990, Noyes Publications, p. 198.
Kern, "Handbook of Semiconductor Wafer Cleaning Technology", 1993, Noyes Publications, pp. 224-226.
Wolf et al., "Silicon Processing for the VLSI Era", 1986, Lattice Press, vol. 1, pp. 161, 514.

* cited by examiner

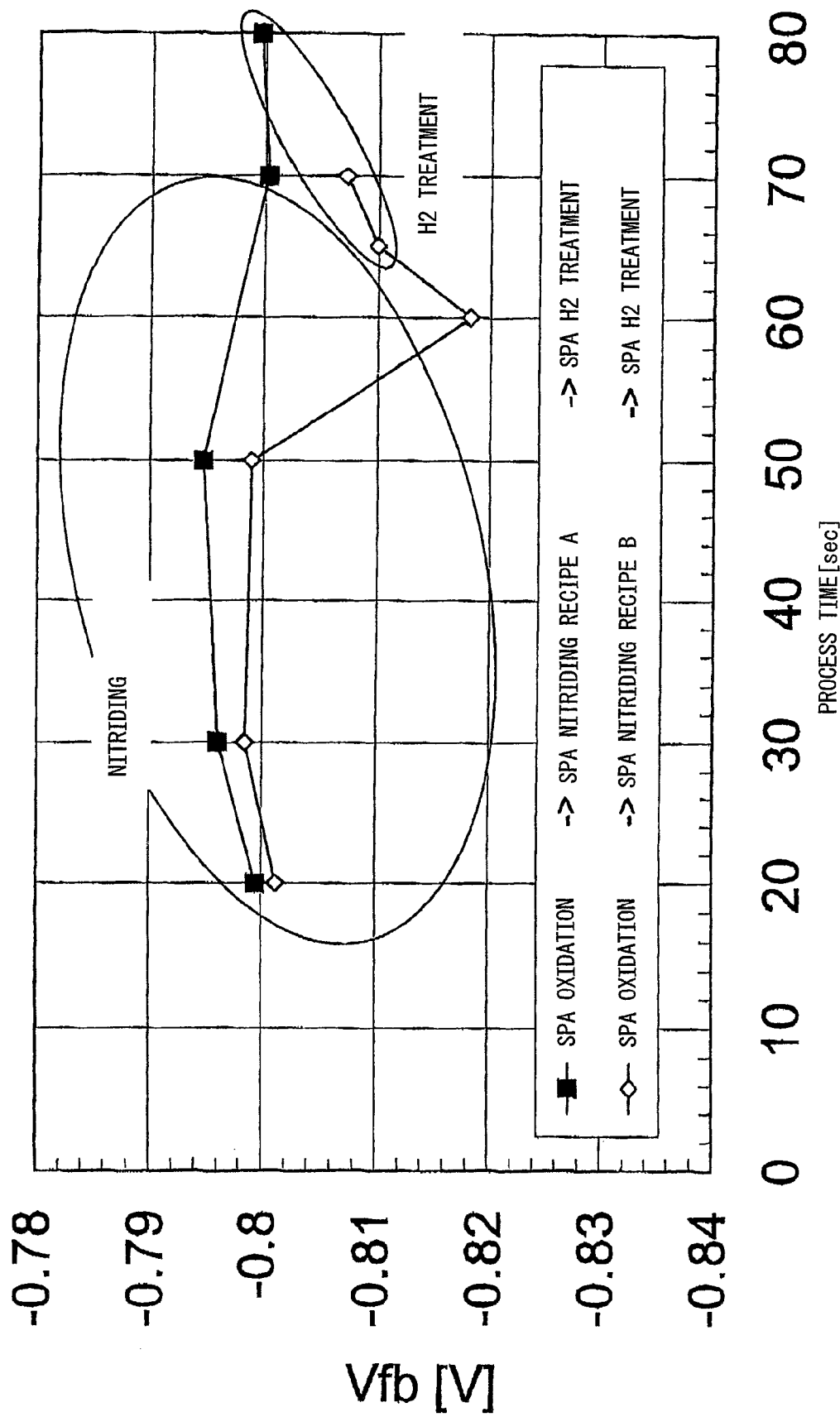

METHOD FOR FORMING INSULATION FILM

CROSS REFERENCE TO RELATED APPLICATION

This application is a divisional application of U.S. application Ser. No. 10/509,370, filed Sep. 28, 2004, now U.S. Pat. No. 7,446,052, which is a National Phase of PCT/JP2003/004091, filed Mar. 31, 2003 and which claims priority under 35 U.S.C. §119 to Japanese Patent Application No. 2002-097906, filed Mar. 29, 2002, the entire disclosures of which are herein expressly incorporated by reference.

TECHNICAL FIELD

The present invention relates to a process for forming an insulating film having various excellent characteristics (for example, control of very small film thickness and a high level of cleanness) with a high efficiency (for example, small footprint provided by conducting various steps in a single reaction chamber, or simplification of operationality and prevention of cross-contamination between apparatuses realized by conducting various steps in separate reaction chambers under the same principle of operation). The process for forming an electronic device material according to the present invention is suitably usable for the formation of a material, for example, for a semiconductor or a semiconductor device (for example, one having an MOS-type semiconductor structure with a gate insulating film having an excellent characteristic).

BACKGROUND ART

The present invention is generally and widely applicable to the formation of electronic device materials, for example, for semiconductors or semiconductor devices and liquid crystal devices. Herein, for the convenience of explanation, the background art relating to semiconductor devices will be explained as an example.

Substrates for semiconductor. or electronic device materials including silicon are subjected to various types of treatment such as formation of insulating films including oxide films, formation of films by CVD or the like, and etching.

It is not too much to say that an improvement in the performance of semiconductor devices in recent years has been achieved by virtue of techniques for microfabrication of the devices including transistors. Even today, an effort is still being made to further improve the transistor microfabrication techniques for higher performance. A demand for a higher level of microfabrication and higher performance of semiconductor devices in recent years has led to ever-increasing needs for insulating films with higher performance, for example, in terms of leakage current. The reason for this is that, in recent microfabricated, highly integrated and/or higher-performance devices, even a low level of leakage current may possibly cause severe problems, although such a leakage current does not pose substantially no problem in the case of conventional relatively low-integrated devices. In particular, low-power consumption devices are indispensable to the development of portable electronic devices in the so-called ubiquitous society (information-oriented society using as a medium electronic devices which can be connected to networks anywhere at any time) which has begun in recent years, and, to this end, a reduction in leakage current is very important.

Typically, for example, in the development of a next-generation or advanced MOS transistor, with the advancement of the above microfabrication technique, the possible thickness reduction of gate insulating films has approached to its limit, and, consequently, a severe problem to be overcome has appeared. More specifically, according to process technology, the thickness of a silicon oxide ($SiO_2$) film, which is currently used as a gate insulating film, can be reduced to the maximum (level of 1 to 2 atomic layers). However, when the film thickness is reduced to 2 nm or less, the leakage current due to a direct tunnel by quantum effect is increased exponentially, so as to increased the power consumption disadvantageously.

At the present time, IT (information technology) markets are being transformed from stationary electronic devices typified, for example, by desktop personal computers and home telephones (devices in which electric power is supplied from a receptacle) to "ubiquitous network society" in which electronic devices are accessible to the Internet and the like anywhere at any time. Therefore, in the very near future, portable terminals such as portable telephones (cellular phones) and car navigation systems are considered to be mainly used. Such portable terminals per se are required to be a high performance device. At the same time, requirements for small size, lightweight, and functions capable of withstanding use for a long period of time should be satisfied, although such requirements are not very important to the above stationary devices. Therefore, in portable terminals, reducing power consumption while improving performance is very important.

Typically, for example, in the development of next-generation MOS transistors, enhancing the level of microfabrication of high-performance silicon LSI poses problems of increased leakage current and increased power consumption. In order to reduce the power consumption while enhancing the performance, the characteristics of MOS transistors should be improved without increasing gate leakage current in the transistors.

The formation of a good-quality and thin (for example, a film thickness of not more than about 15 A (angstroms)) insulating film is indispensable for simultaneously achieving an enhancement in the level of microfabrication and an improvement in characteristics.

However, the formation of a good-quality and thin insulating film is very difficult. For example, an insulating film formed by conventional thermal oxidation or CVD (chemical vapor deposition method) is unsatisfactory in any one of characteristics, i.e., either film quality or film thickness.

DISCLOSURE OF INVENTION

An object of the present invention is to solve the drawbacks encountered in the prior art and to provide a process for forming a thin insulating film on a substrate for an electronic device.

Another object of the present invention is to provide a process for forming a thin insulating film on the surface of a substrate for an electronic device, which can suitably carry out post-treatment (for example, formation of films by CVD or the like and etching) and can provide an insulating film excellent in both film quality and film thickness.

A further object of the present invention is to carry out various steps involved in the formation of an insulating film under the same principle of operation, thereby simplifying the apparatus form and efficiently forming an insulating film having an excellent characteristic. As a result of earnest study, the present inventors have found that the formation of an insulating film by a method which enables not only the practice of one step in one apparatus as in the prior art but also the practice of various steps in a single apparatus is very effective for attaining the above objects.

The process or forming an insulating film formation on the surface of a substrate for an electronic device according to the present invention is based on the above discovery. More specifically the process comprises: at least two steps of regulating the characteristic of the insulating film, wherein the at least two steps of regulating the characteristic of the insulating film are conducted under the same operation principle.

For example, the present invention may include some embodiments wherein the application of plasma to a substrate for an electronic device using a process gas comprising at least a rare gas can provide a cleaning effect, the incorporation of oxygen or nitrogen in the same plasma causes oxidation or nitridation, or the application of the same plasma containing at least hydrogen to an oxygen atom-containing insulating film including an oxide film can reduce the thickness of the insulating film.

In the process for forming an insulating film according to the present invention having the above constitution, for example, an insulating film having any desired thickness can easily be formed by forming a film having a desired thickness with attention focused on film quality and then reducing the film thickness by a specific plasma treatment.

BRIEF DESCRIPTION OF DRAWINGS

FIG. 7b is a diagram showing a change in the electrical film thickness of a film similar to that of FIG. 6 with the elapse of time (i.e., a change in the electrical film thickness in each step). In this figure, the abscissa denotes the treatment time, and the ordinate denotes the electrical film thickness.

BEST MODE FOR CARRYING OUT THE INVENTION

Figure 1:
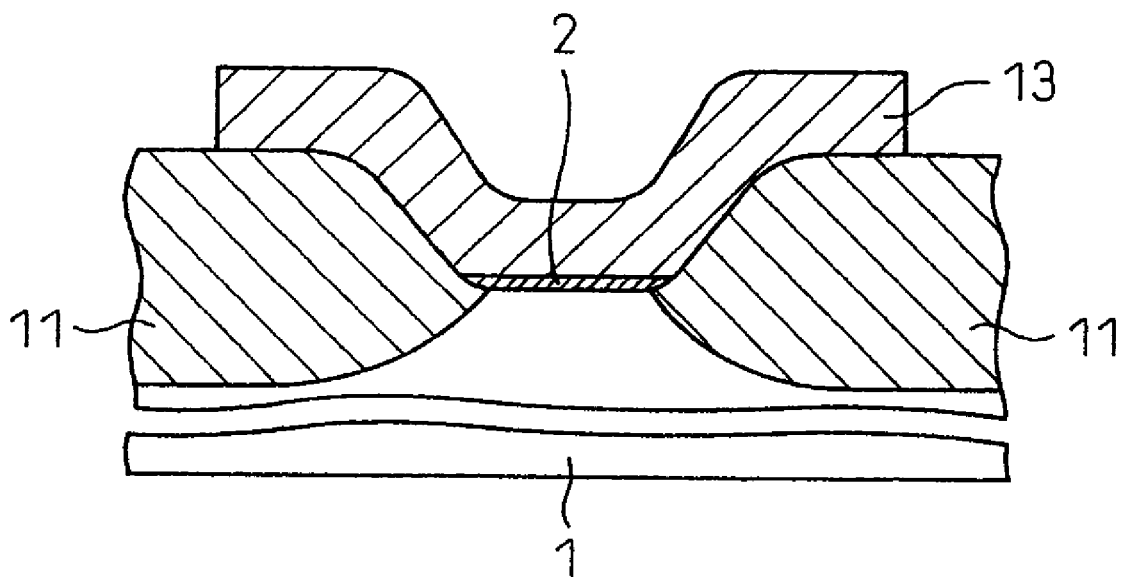
FIG. 1 is a schematic sectional view showing one embodiment of an MOS structure which can be formed according to the present invention.

Hereinbelow, the present invention will be described in detail with reference to the accompanying drawings as desired. In the following description, "%" and "part(s)" representing a quantitative proportion or ratio are those based on mass, unless otherwise specifically noted.

(Process for Forming Insulating Film)

In the present invention, a very thin (not more than 15 A) insulating film can be formed by adopting a desired combination of two or more steps, e.g., a step of applying plasma to a substrate for an electronic device using a process gas comprising at least a rare gas to attain a cleaning effect, a step of incorporating oxygen or nitrogen in the same plasma for oxidation or nitridation, and a step of applying the same plasma containing at least hydrogen to an oxygen atom-containing insulating film including an oxide film to reduce the thickness of the insulating film. The process for forming an insulating film according to the present invention can be applied to any object without particular limitation. For example, the present invention can provide a thin insulating film having a surface particularly suitable for the formation of a film of a high-dielectric constant (high-k) material sensitive to the film-forming conditions and the like.

(Insulating Film to be Formed)

The composition, thickness, production process, and properties of an insulating film formable by the present invention are as follows.

Composition: oxide film, oxynitride film, and nitride film

Production process: a process in which, in a single vessel using plasma comprising at least a rare gas, one or at least two of a step of cleaning, a step of oxidation, a step of nitriding, and a step of film thickness reduction is carried out on an electronic substrate; or a process in which plasma comprising at least a rare gas is produced within a plurality of vessels under the same principle of operation and a step of cleaning, a step of oxidation, a step of nitriding, or a step of film thick reduction is carried out on an electronic substrate.

Thickness: physical thin film 5 A to 20 A (Evaluation of Film Quality and Film Thickness)

The level of the film quality and the level of the film thickness of the thin insulating film, which has been formed according to the present invention, can be suitably evaluated, for example, by actually forming a film of a high-k material on the surface of the thin film. In this case, whether or not a high-quality high-k material film has been formed can be evaluated, by a method wherein a standard MOS semiconductor structure as described in a publication (see, Masanori Kishino and Mitsumasa Koyanagi, "VLSI Device no Butsuri (Physics of VLSI Devices)", pp. 62-63, published by Maruzen) is fabricated and the evaluation of the characteristic of the thus fabricated MOS can be used as the evaluation of the characteristic of the insulating film itself. This is because, in such a standard MOS structure, the characteristic of the insulating film constituting the MOS structure has much effect on the MOS characteristic.

Regarding the formation of this MOS structure, for example, an MOS capacitor comprising a high-k material film can be formed under conditions of Example 1 appearing hereinafter. In the formation of an MOS capacitor comprising a high-k material film under conditions of Example 1, according to the present invention, it is preferred that (1) flatband characteristic or (2) leak characteristic (more preferably, both of these) as described below are provided.

(1) Preferred flatband characteristic: Within ±50 mV as compared with thermally grown oxide film (2) Leak characteristic: Reduction by one figure (or digit) as compared with thermally grown oxide film, or less (Combination with Post-treatment)

A thin insulating film formed by the process for forming an insulating film according to the present invention is suitable for the subsequent various types of treatment. The "post-treatment" is not particularly limited and may be various types of treatment such as formation of an oxide film, formation of film by CVD or the like, and etching. The process for forming an insulating film according to the present invention can be carried out at a low temperature. Therefore, regarding the subsequent treatment as well, a combination with treatment under relatively low (preferably 600° C. or below, more preferably 500° C. or below) temperature conditions is particularly effective. The reason for this is that, since the use of the present invention enables the formation of an oxide film, i.e., one of the steps requiring the highest temperature in the device preparation process, to be carried out at a low temperature, a device can be prepared while avoiding a high-temperature heat history.

(Substrate for Electronic Device)

The substrate for an electronic device usable in the present invention is not particularly limited, and one or a combination of two or more of conventional substrates for an electronic device may be properly selected and used. Examples of such substrates for an electronic device may include semiconductor materials and liquid crystal device materials. Examples of semiconductor materials may include materials mainly comprising single-crystal silicon and materials mainly comprising silicon germanium.

(Process Gas)

Any process gas may be used in the present invention without particular limitation, as long as the gas contains at least a rare gas, and one or a combination of two or more of conventional process gases usable in the production of electronic devices may be properly selected and used. Examples of such process gases (rare gas) may include: Ar (argon), He (helium), Kr (krypton), Xe (xenon), Ne (neon), $O_2$ (oxygen), $N_2$ (nitrogen), $H_2$ (hydrogen), and $NH_3$ (ammonia).

(Treatment Conditions)

In the formation of an insulating film according to the present invention, the following conditions are suitably usable from the viewpoint of the property of the thin insulating film to be formed.

Rare gas (for example, Kr, Ar, He, Xe, or Ne): 500 to 3000 sccm, more preferably 1000 to 2000 sccm.

In a step of cleaning, a process gas comprising at least a rare gas may be used, and a hydrogen gas may further be added. The flow rate of the hydrogen gas $H_2$ may be 0 to 100 sccm, more preferably 0 to 50 sccm. In a step of oxidation, a process gas comprising at least a rare gas and oxygen may be used, and the flow rate of the oxygen gas $O_2$ may be 10 to 500 sccm, more preferably 10 to 200 sccm.

In a step of nitriding, a process gas comprising at least a rare gas and nitrogen may be used, and the flow rate of the nitrogen gas $N_2$ may be 3 to 300 sccm, more preferably 20 to 200 sccm.

In a step of etching, a process gas comprising at least a rare gas and hydrogen may be used, and the flow rate of the hydrogen gas $H_2$ is 0 to 100 sccm, more 5 preferably 0 to 50 sccm.

Temperature: room temperature 25° C. to 500° C., more preferably 250 to 500° C., particularly preferably 250 to 400° C.

Pressure: 3 to 500 Pa, more preferably 7 to 260 Pa

Microwave: 1 to 5 $W/cm^2$, more preferably 2 to 4 $W/cm^2$, particularly preferably 2 to 3 $W/cm^2$ In the present invention, any plasma may be used without particular limitation. It is preferred to use plasma with a relatively low electron temperature and a high density, from the viewpoint of easiness on uniform film thickness reduction.

(Suitable Plasma)

The property of plasma which is suitably used in the present invention is as follows.

Electron temperature: 0.5 to 2.0 eV

Density: 1 E10 to 5 $E12/cm^3$

Uniformity of plasma density: ±10%

(Plane Antenna Member)

In the process for forming an insulating film according to the present invention, it is preferred that plasma with a low electron temperature and a high density is formed by the application of microwaves through a plane antenna member provided with a plurality of slots. In the present invention, since an oxynitride film is formed using plasma having such an excellent property, a low-plasma damage, low-temperature, and highly reactive process can be realized. Further, in the present invention, as compared with the use of conventional plasma, the application of microwaves through the plane antenna member is advantageous in that an insulating film, the thickness of which has been more suitably reduced can easily be formed.

According to the present invention, an insulating film with a reduced film thickness can be formed. Therefore, a semiconductor device structure having an excellent characteristic can easily be formed by forming another layer (for example, another insulating layer) on the insulating film with a reduced film thickness. The insulating film with a thickness reduced by the present invention is particularly suitable for the formation of a high-k material film on the surface of the insulating film with a reduced film thickness.

(High-k Material)

The high-k material usable in the present invention is not particularly limited. The value of the k (specific dielectric constant) may preferably be not less than 7, more preferably, not less than 10, from the viewpoint of increasing the physical film thickness.

Preferred examples of the high-k material may be one or at least two high-k materials selected from the group consisting of: $Al_2O_3$r $ZrO_2$, $HfO_2$, $Ta_2O_5$, and silicates such as ZrSiO, HfSiO; aluminates such as ZrAlO.

(Treatment in the Same Vessel)

The expression "in the same vessel" which will be described below means that, after a certain step, the substrate to be treated is subjected to a subsequent treatment without passage through the wall of the vessel. In the case of the use of the so-called "cluster" structure using a combination of a plurality of vessels, when the transfer of the substrate between different vessels constituting the cluster is carried out, this treatment is not treatment "in the same vessel" referred to in the present invention.

In this way, in the present invention, "in the same vessel" without the exposure of the substrate to be formed (such as a silicon substrate) to the air, a plurality of steps can be successively carried out in a reaction chamber under the same principle. For example, a reduction in footprint can be realized by conducting all steps in a single reaction chamber. Further, also when the individual steps are carried out in respective separate reaction chambers, since reaction chambers identical to each other in the principle of operation are arranged, the same gas piping and operation panel can be used, to thereby realize an excellent maintenance and operationality. Further, the same apparatus is used, there is no significant fear of cross-contamination between the apparatuses. Even when a cluster construction using a plurality of reaction chambers is adopted, the processing order can be changed in various ways. A gate insulating film having various characteristics can be prepared by this method.

The oxide film or oxynitride film formed according to the present invention as such may be used as a gate insulating film. Alternatively, a process may be adopted which comprises forming a very thin (about 10 A (angstroms)) oxide film or oxynitride film according to the present invention and forming thereon a film of a material a having high dielectric constant such as a high-k material. According to this method, a stacked gate insulating film structure (gate stack structure) having a higher level of interfacial characteristic (such as a higher level of transistor carrier mobility) than the gate insulating film formed using a high-k material only.

(Suitable Characteristic of MOS Semiconductor Structure)

The very thin and good-quality insulating film formable on the substrate cleaned by the present invention is particularly suitable for the utilization as an insulating film in a semiconductor device (particularly, a gate insulating film in an MOS semiconductor structure).

According to the present invention, as described below, an MOS semiconductor structure having suitable characteristic can easily be produced. The characteristic of the oxynitride film formed by the present invention can be evaluated, by a method wherein a standard MOS semiconductor structure as described in a publication (see, Masanori Kishino and Mitsumasa Koyanagi, "Physics of VLSI Devices", pp. 62-63, published by Maruzen) is fabricated and the evaluation of the characteristic of the thus fabricated MOS can be used as the evaluation of the characteristic of the oxynitride film itself. This is because, in such a standard MOS structure, the characteristic of the oxynitride film constituting the MOS structure has much effect on the MOS characteristic.

One Embodiment of Production Apparatus

A preferred embodiment of the production process according to the present invention will be described.

At the outset, regarding one embodiment of the structure of a semiconductor device which can be produced by the production process of an electronic device material according to the present invention, a semiconductor device having an MOS structure provided with a gate insulating film as an insulating film will be described with reference to FIG. 1.

In FIG. 1(a), reference numeral 1 designates a silicon substrate, numeral 11a field oxide film, numeral 2a gate insulating film, and numeral 13a gate electrode. As described above, in the production process according to the present invention, a very thin and good-quality gate insulating film 2 can be formed. As shown in FIG. 1(b), this gate insulating film 2 comprises a high-quality insulating film formed at the interface of the silicon substrate 1. For example, the gate insulating film 2 comprises an about 2 nm-thick oxide film or oxynitride film.

In this embodiment, it is preferred that this high-quality oxide film 2 comprises a silicon oxynitride film (hereinafter referred to as "SiON film") formed using plasma produced on the surface of an object substrate mainly comprising silicon (Si) by applying microwave through a plane antenna member provided with a plurality of slots to the substrate in the presence of a process gas containing $O_2$, $N_2$ and rare gas. When this SiON 2 film is used, as described below, advantageously, the interphase interfacial quality (for example, interfacial level) is good, and, in the form of an MOS structure, good gate leak characteristic can easily be provided In the embodiment shown in FIG. 1, a gate electrode 13 mainly comprising silicon (polysilicon or amorphous silicon) is further provided on the surface of the silicon oxynitride film.

One Embodiment of Production Process

A process for forming of the above silicon oxynitride film will be described.

Figure 2:
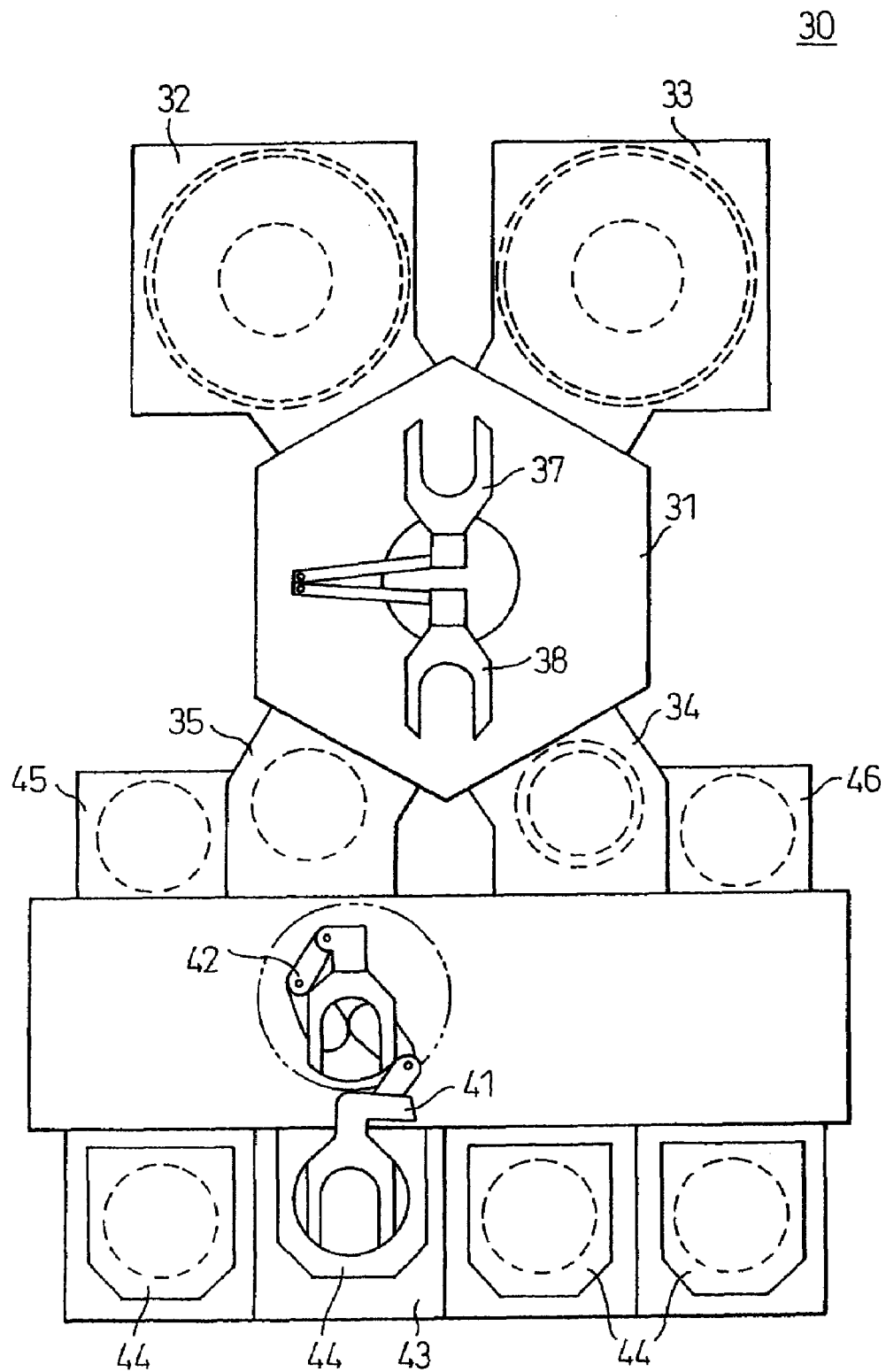
FIG. 2 is a partial schematic sectional view showing one embodiment of a semiconductor production device usable in the process for forming an insulating film according to the present invention.

FIG. 2 is schematic view (schematic plan view) showing an example of the total arrangement of a semiconductor manufacturing equipment 30 for conducting the process for producing an electronic device material according to the present invention.

Figure 3:
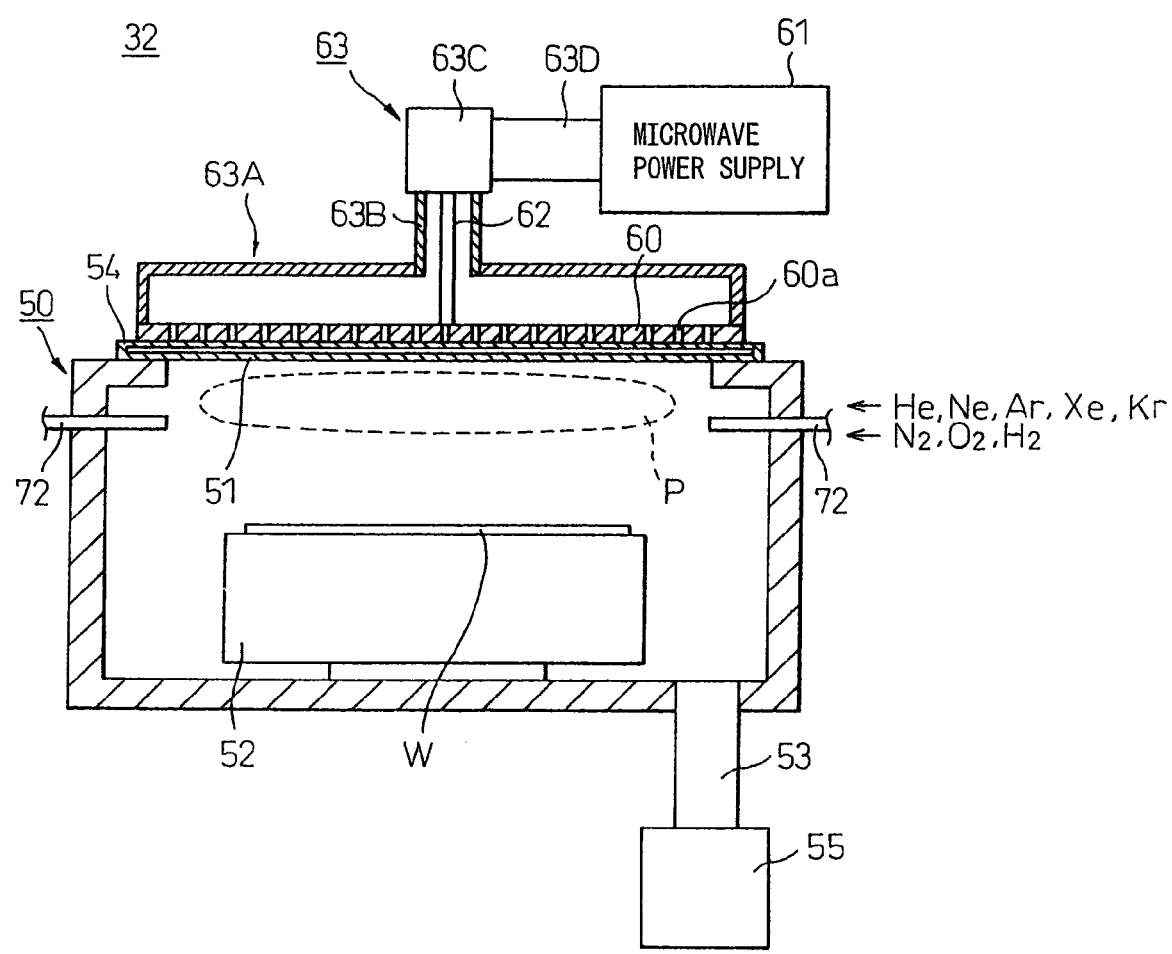
FIG. 3 is a schematic vertical sectional view showing one embodiment of a plane antenna member (RLSA; also referred to as slot plane antenna or SPA) plasma processing unit usable in the process for forming an insulating film according to the present invention.

As shown in FIG. 2, in a substantially central portion of the semiconductor manufacturing equipment 30, there is disposed a transportation chamber 31 for transporting a wafer W (FIG. 3). Around the transportation chamber 31, there are disposed: plasma processing units 32 and 33 for conducting various treatments on the wafer, two load lock units 34 and 35 for conducting the communication/cutoff between the respective processing chambers, a heating unit 36 for operating various heating treatments, and a heating reaction furnace 47 for conducting various heating treatments on the wafer. These units are disposed so as to surround the transportation chamber 31.

On the side of the load lock units 34 and 35, a preliminary cooling unit 45 and a cooling unit 46 for conducting various kinds of preliminary cooling and cooling treatments are disposed.

In the inside of transportation chamber 31, transportation arms 37 and 38 are disposed, so as to transport the wafer W (FIG. 2) between the above-mentioned respective units 32-36.

On the foreground side of the load lock units 34 and 35 in this figure, loader arms 41 and 42 are disposed. These loader arms 41 and 42 can put wafer W in and out with respect to four cassettes 44 which are set on the cassette stage 43, which is disposed on the foreground side of the loader arms 41 and 42.

In FIG. 2, as the plasma processing units 32 and 33, two plasma processing units of the same type are disposed in parallel.

Further, it is possible to exchange both of the plasma processing units 32 and 33 with a single-chamber type CVD process unit. It is possible to set one or two of such a single-chamber type CVD process unit in the position of the plasma processing units 32 and 33.

When two plasma processing units 32 and 33 are used, it is possible that an $SiO_2$ film is formed in the plasma processing unit 32, and then the $SiO_2$ film is subjected to surface nitridation in the plasma processing unit 33. Alternatively, it is also possible an $SiO_2$ film is formed, and the $SiO_2$ film is surface-nitrided in parallel, in the plasma processing units 32 and 33.

One Embodiment of Plasma Processing Apparatus

FIG. 3 is a schematic sectional view in the vertical direction showing the plasma processing unit 32 (or 33) which is usable in the film formation of the gate insulator 2.

Referring to FIG. 3, reference numeral 50 denotes a vacuum container made of, e.g., aluminum. In the upper portion of the vacuum container 50, an opening portion 51 is formed so that the opening portion 51 is larger than a substrate (for example, wafer W). A top plate 54 in a flat cylindrical shape made of a dielectric such as quartz and aluminum oxide so as to cover the opening portion 51. In the side wall of the upper portion of vacuum container 50 which is below the top plate 54, gas feed pipes 72 are disposed in the 16 positions, which are arranged along the circumferential direction so as to provide equal intervals therebetween. A process gas comprising at least one kind of gas selected from $O_2$, inert gas, $N_2$, $H_2$, etc., can be supplied into the vicinity of the plasma region P in the vacuum container 50 from the gas feed pipes 72 evenly and uniformly.

On the outside of the top plate 54, there is provided a radio-frequency power source, via a plane antenna member 60 having a plurality of slots, which comprises a plane antenna (RLSA) made from a copper plate, for example. As the radio-frequency power source, a waveguide 63 is disposed on the top plate 54, and the waveguide 63 is connected to a microwave power supply 61 for generating microwave of 2.45 GHz, for example. The waveguide 63 comprises a combination of: a flat circular waveguide 63A, of which lower end is connected to the RLSA 60; a circular waveguide 63B, one end of which is connected to the upper surface side of the circular waveguide 63A; a coaxial waveguide converter 63C connected to the upper surface side of the circular waveguide 63B; and a rectangular waveguide 63D, one end of which is connected to the side surface of the coaxial waveguide converter 63C so as to provide a right angle therebetween, and the other end of which is connected to the microwave power supply 61.

In the inside of the above-mentioned circular waveguide 63B, an axial portion 62 of an electroconductive material is coaxially provided, so that one end of the axial portion 62 is connected to the central (or nearly central) portion of the RLSA 60 upper surface, and the other end of the axial portion 62 is connected to the upper surface of the circular waveguide 63B, whereby the circular waveguide 63B constitutes a coaxial structure. As a result, the circular waveguide 63B is constituted so as to function as a coaxial waveguide.

In addition, in the vacuum container 50, a stage 52 for carrying the wafer W is provided so that the stage 52 is disposed opposite to the top plate 54. The stage 52 contains a temperature control unit (not shown) disposed therein, so that the stage can function as a hot plate. Further, one end of an exhaust pipe 53 is connected to the bottom portion of the vacuum container 50, and the other end of the exhaust pipe 53 is connected to a vacuum pump 55.

One Embodiment of RLSA

Figure 4:
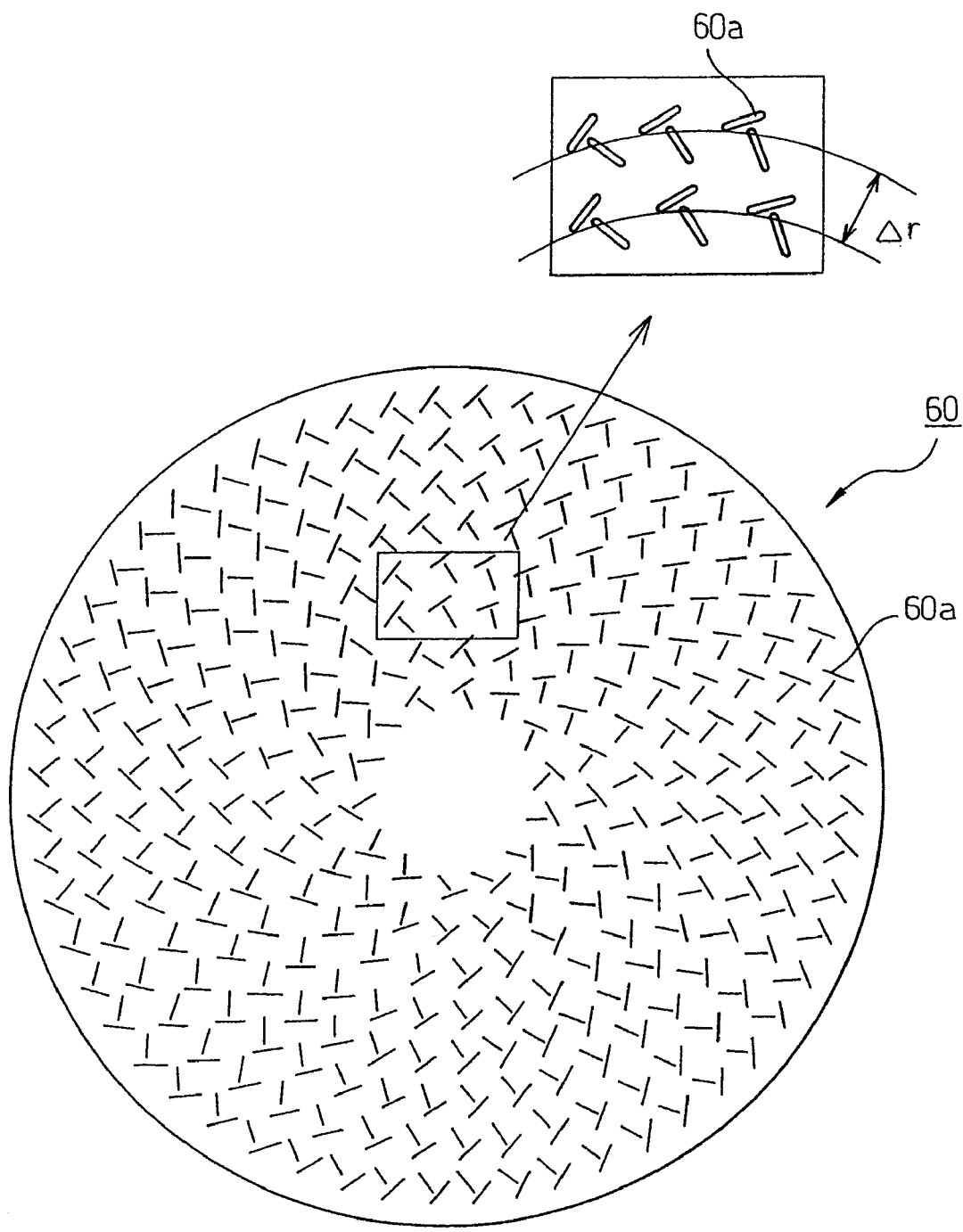
FIG. 4 is a schematic plan view showing one embodiment of RLSA usable in a apparatus for producing an electronic device material according to the present invention.

FIG. 4 is a schematic plan view showing an example of RLSA 60 which is usable in an apparatus for producing an electronic device material according to the present invention.

As shown in this FIG. 4, on the surface of the RLSA 60, a plurality of slots 60a, 60a, . . . are provided in the form of concentric circles. Each slot 60a is a substantially square penetration-type groove. The adjacent slots are disposed perpendicularly to each other and arranged so as to form a shape of alphabetical "T"-type character. The length and the interval of the slot 60a arrangement are determined in accordance with the wavelength of the microwave supplied from the microwave power supply unit 61.

Embodiment of Plasma Processing

Next, there is described an embodiment of the process processing to be used in the present invention.

A gate valve (not shown) provided at the side wall of the vacuum container 50 in the plasma processing unit 32 (FIG. 2) is opened, and the above-mentioned wafer W comprising the silicon substrate 1, and the field oxide film 11 formed on the surface of the silicon substrate 1 is placed on the stage 52 (FIG. 3) by means of transportation arms 37 and 38.

Next, the gate valve was closed so as to seal the inside of the vacuum container 50, and then the inner atmosphere therein is exhausted by the vacuum pump 55 through the exhaust pipe 53 so as to evacuate the vacuum container 50 to a predetermined degree of vacuum and a predetermined pressure in the container 50 is maintained. On the other hand, microwave (e.g., of 1.80 GHz and 2200 W) is generated by the microwave power supply 61, and the microwave is guided by the waveguide so that the microwave is introduced into the vacuum container 50 via the RLSA 60 and the top plate 54, whereby radio-frequency plasma is generated in the plasma region P of an upper portion in the vacuum container 50.

Herein, the microwave is transmitted in the rectangular waveguide 63D in a rectangular mode, and is converted from the rectangular mode into a circular mode by the coaxial waveguide converter 63C. The microwave is then transmitted in the cylindrical coaxial waveguide 63B in the circular mode, and transmitted in the circular waveguide 63A in the expanded state, and is emitted from the slots 60a of the RLSA 60, and penetrates the plate 54 and is introduced into the vacuum container 50. In this case, microwave is used, and accordingly a high-density and low-electron temperature plasma can be generated. Further, the microwave is emitted from a large number of slots 60a of the RLSA 60, and accordingly the plasma is caused to have a uniform distribution.

When an oxide film is formed, the wafer W is introduced into the reaction chamber 50 (FIG. 3) prior to the induction of microwave, and a process gas comprising a rare gas (such as krypton and argon) and oxygen gas as a gas for forming an oxide film, is introduced at flow rates of 2000 sccm and 200 sccm, respectively, into the reaction chamber from the gas feed pipe 52, while heating the wafer with the stage 52. The pressure of the reaction chamber is maintained at 133 Pa and microwave is introduced thereinto at 2 W/cm² so as to generate plasma, and oxygen radicals are caused to react on the substrate W surface, to thereby form a silicon oxide film. In the case of pre-oxidation treatment, it is preferred to use a rare gas only, or a rare gas and hydrogen gas as the process gas. In the case of nitridation treatment, it is preferred to use a rare gas and nitrogen-containing gas as the process gas.

Hereinbelow, the present invention will be described in more detail with reference to Examples.

EXAMPLES

Example 1

A device (N-type MOS capacitor) for carrying out various evaluations was formed by the following method.

(1): Substrate (FIG. 9)

Figure 9:
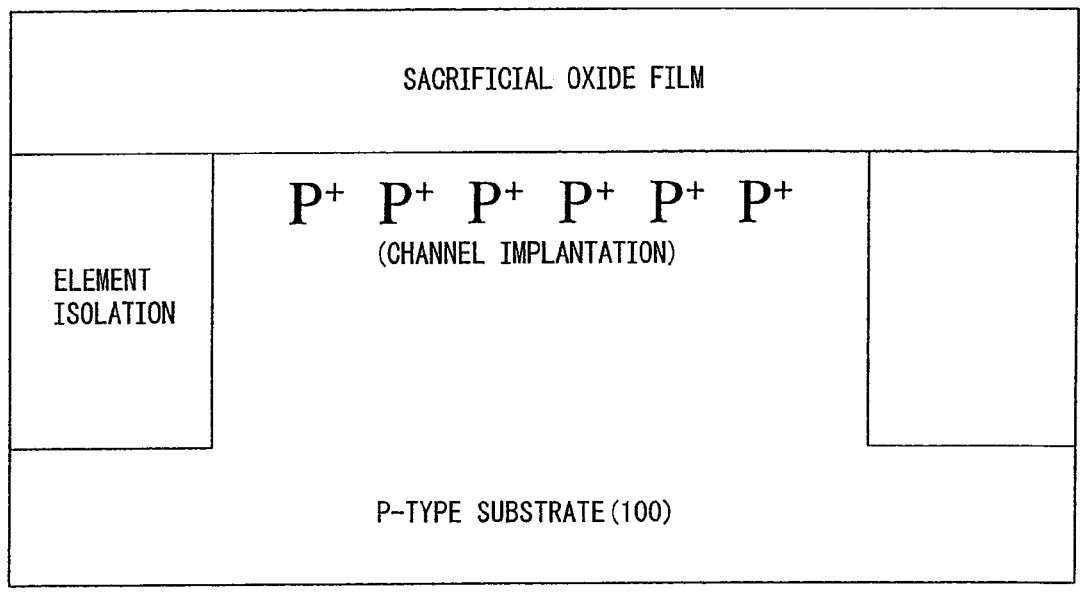
FIG. 9 is a schematic sectional view showing one embodiment of the surface of a silicon substrate on which a gate oxide film and a gate insulating film are to be formed.

As shown in FIG. 9, a P-type silicon substrate having a specific resistance of 8 to 12 Ωcm and plane orientation (100) was used as a substrate. The surface of the silicon substrate had a sacrificial oxide film with a thickness of 500 A (angstrom) previously formed by thermal oxidation.

(2): Cleaning Before Gate Oxidation

The sacrificial oxide film and contamination elements (metals and organic matter, particles) were removed by RCA cleaning using a combination of APM (a mixed liquid composed of ammonia, aqueous hydrogen peroxide, and pure water) with HPM (a mixed liquid composed of hydrochloric acid, aqueous hydrogen peroxide, and pure water) and DHF (a mixed liquid composed of hydrofluoric acid and pure water).

Figure 10:
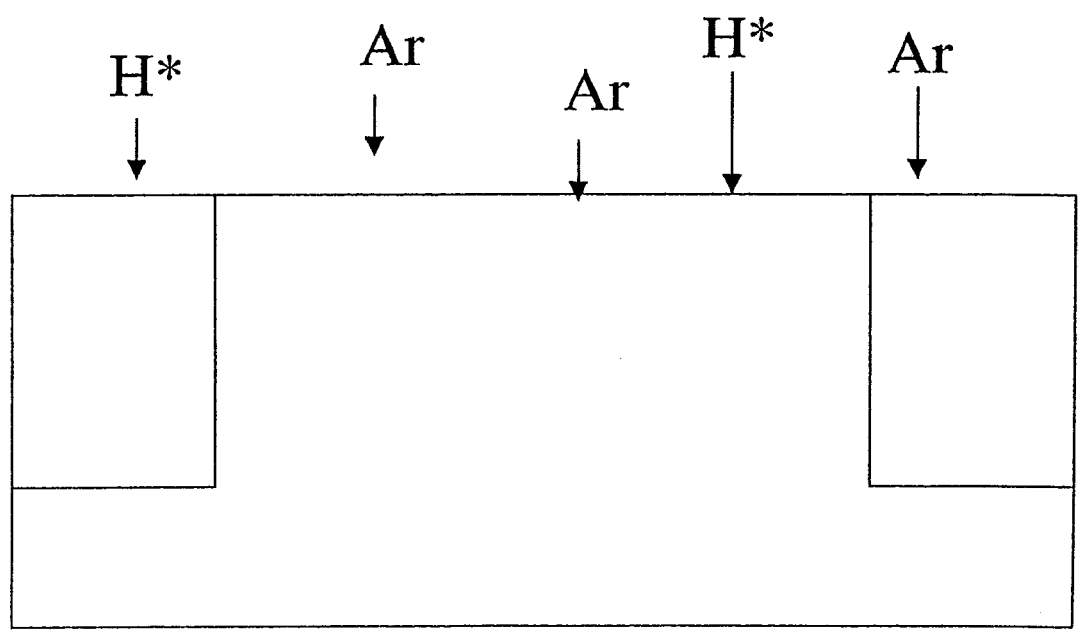
FIG. 10 is a schematic sectional view showing one embodiment of plasma treatment to be effected on the surface of a substrate.

(3): Plasma Treatment Before Oxidation (FIG. 10)

After the treatment in the above step (2), RLSA plasma treatment was carried out on the substrate (FIG. 10) under the following conditions. A wafer was transferred to a reaction chamber indicated by 32 in FIG. 2 and FIG. 3 under vacuum (back pressure: not more than $1\times10^{-4}$ Pa), and the conditions were then held in the following manner: substrate temperature of 400° C., rare gas (for example, Ar gas) of 1000 sccm, and pressure of 7 Pa to 133 Pa (50 mTorr to 1 Torr). A microwave was applied at 2 to 3 W/cm² to this atmosphere through a plane antenna member (RLSA) having a plurality of slots to generate rare gas plasma for plasma treatment on the substrate surface (FIG. 10). As desired, hydrogen (5 to 30 sccm) may be contained in the rare gas for hydrogen pre-oxidation plasma treatment.

Figure 11:
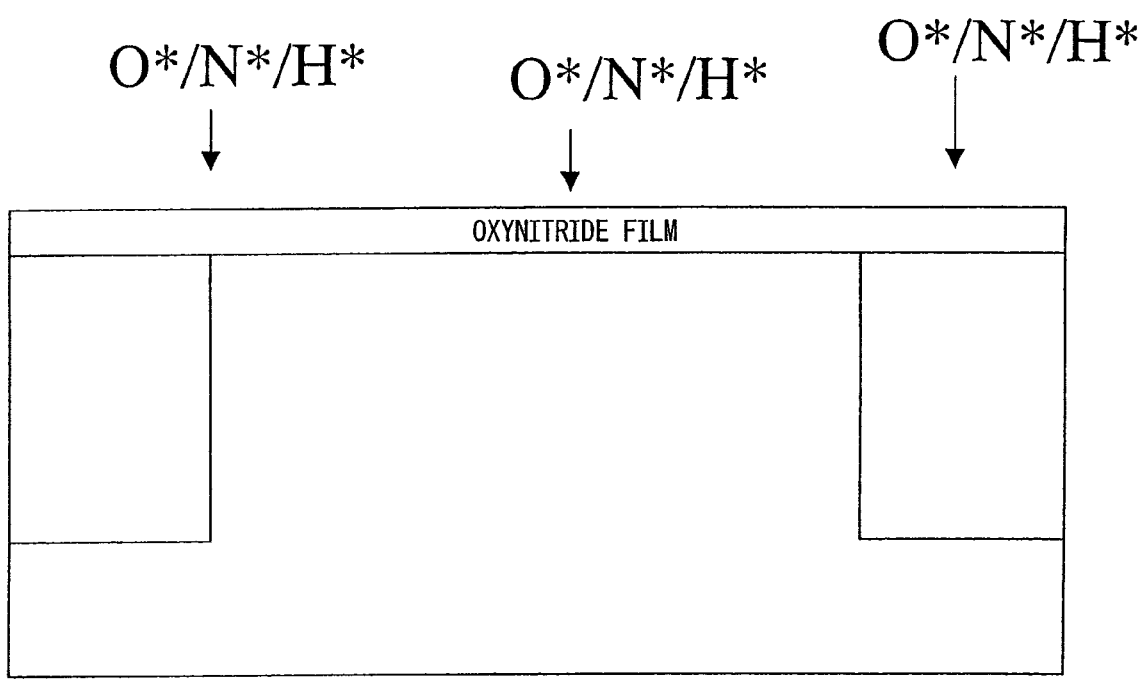
FIG. 11 is a schematic sectional view showing one embodiment of the formation of an $SiO_2$ film on a substrate using plasma, nitriding, and hydrogen plasma treatment.

(4): Plasma Oxidation Process (FIG. 11)

An oxide film was formed by the following method on the silicon substrate treated in the step (3). While avoiding the exposure of the silicon substrate treated in the step (3) to the air, the silicon substrate is subjected to treatment by the following process (for example, treatment in an identical reaction chamber 32, or treatment using a vacuum transfer system in other reaction chamber 33 while avoiding exposure to the air). According to this method, oxidation treatment can be carried out while optimally maintaining the organic contaminant removing effect and the spontaneous oxide film removing effect attained by the treatment in the step (3). More specifically, rare gas and oxygen were allowed to flow respectively 25 to 500 sccm over the silicon and the pressure was held at to 1000 mTorr). A microwave to this atmosphere through a at 1000 to 2000 sccm and 50 substrate heated at 400° C., 13 Pa to 133 Pa (100 mTorr was applied at 2 to 3 W/cm² plane antenna member (RLSA) having a plurality of slots to generate plasma containing oxygen and rare gas, and this plasma was used for the formation of an $SiO_2$ film on the substrate treated in the step (3) (FIG. 11). Further, the film thickness was regulated by varying treatment conditions including treatment time.

(5): Plasma Nitriding Process (FIG. 11)

Nitriding was carried out by the following method on the oxide film formed in the step (4). While avoiding the exposure of the oxide film formed in the step (4) to the air, the oxide film is subjected to treatment by the following process (for example, treatment in an identical reaction chamber 32, or treatment using a vacuum transfer system in other reaction chamber 33 while avoiding exposure to the air). According to this method, nitriding treatment can be carried out while suppressing organic matter contamination and an increase in spontaneous oxide film on the upper part of the oxide film formed in the treatment in the step (4). More specifically, rare gas and nitrogen were allowed to flow respectively at 500 to 2000 sccm and 4 to 500 sccm over the silicon substrate heated at 400° C., and the pressure was held at 3 Pa to 133 Pa (20 mTorr to 1000 mTorr). A microwave was applied at 3 W/cm² to this atmosphere through a plane antenna member (RLSA) having a plurality of slots to generate plasma containing nitrogen and rare gas, and this plasma was used for the formation of an oxynitride film (SiON film) on the substrate (FIG. 11).

(6): Film thickness reduction and recovery of Vfb shift by hydrogen plasma (FIG. 11)

Annealing treatment with hydrogen plasma was carried out on the oxynitride film formed in the treatment in the step (5) by the following method. While avoiding the exposure of the oxynitride film formed in the treatment in the step (5) to the air, the oxynitride film is subjected to treatment by the following process (for example, treatment in an identical reaction chamber 32, or treatment using a vacuum transfer system in other reaction chamber. 33 while avoiding exposure to the air). According to this method, hydrogen plasma annealing treatment can be carried out while suppressing organic matter contamination and an increase in spontaneous oxide film on the upper part of the oxynitride film formed in the treatment in the step (5). More specifically, rare gas and hydrogen were allowed to flow respectively at 500 to 2000 sccm and 4 to 500 sccm over the silicon substrate heated at 400° C., and the pressure was held at 3 Pa to 133 Pa (20 mTorr to 1000 mTorr). A microwave was applied at 2 to 3 W/cm² to this atmosphere through a plane antenna member (RLSA) having a plurality of slots to generate plasma containing hydrogen and rare gas, and this plasma was used for hydrogen plasma annealing treatment on the oxynitride film (FIG. 11). In FIG. 11, for the SIMS analysis sample, the treatment was stopped in this step, and the analysis was carried out.

(7): Formation of Polysilicon Film for Gate Electrode

A polysilicon film was formed as a gate electrode by CVD on the oxynitride film formed through the treatment in the steps (3) to (6). The silicon substrate with an oxynitride film formed thereon was heated at 630° C., and silane gas (250 sccm) was supplied under a pressure of 33 Pa over the substrate, followed by holding for 30 min to form a 3000 A-thick polysilicon film for an electrode on the $SiO_2$ film.

(8): Doping of P (phosphorus) into Polysilicon

The silicon substrate prepared in the step (7) was heated to 875° C., and $POCl_3$ gas, oxygen and nitrogen were supplied respectively at 350 sccm, 200 sccm, and 20000 sccm under the atmospheric pressure over the substrate, followed by holding for 24 min. to dope phosphorus into the polysilicon.

(9): Patterning and Gate Etching

Patterning was carried out by lithography on the silicon substrate prepared in the step (8), and the silicon substrate was then immersed in a liquid chemical of $HF:HNO_3:H_2O=1:60:60$ for 3 min. to dissolve polysilicon in its parts remaining unpatterned. Thus, an MOS capacitor was prepared.

Example 2

The measurement of the MOS capacitor prepared in Example 1 was carried out by the following methods. The capacitor having a gate electrode area of 10,000 (m2 was evaluated for CV and IV characteristic. The CV characteristic were determined by sweeping the gate voltage from +1 V to about −3 V at a frequency of 100 kHz and evaluating the capacitance at each voltage. The electrical film thicknesses and Vfb (flatband voltage) were calculated from the CV characteristic. The IV characteristic were determined by sweeping the gate voltage from 0 V to about −5 V and evaluating the value of current which flows at each voltage (leakage current value). The leakage current value at a gate electrode voltage obtained by subtracting −0.4 V from Vfb determined from the CV measurement was calculated from the IV characteristic.

Figure 5:
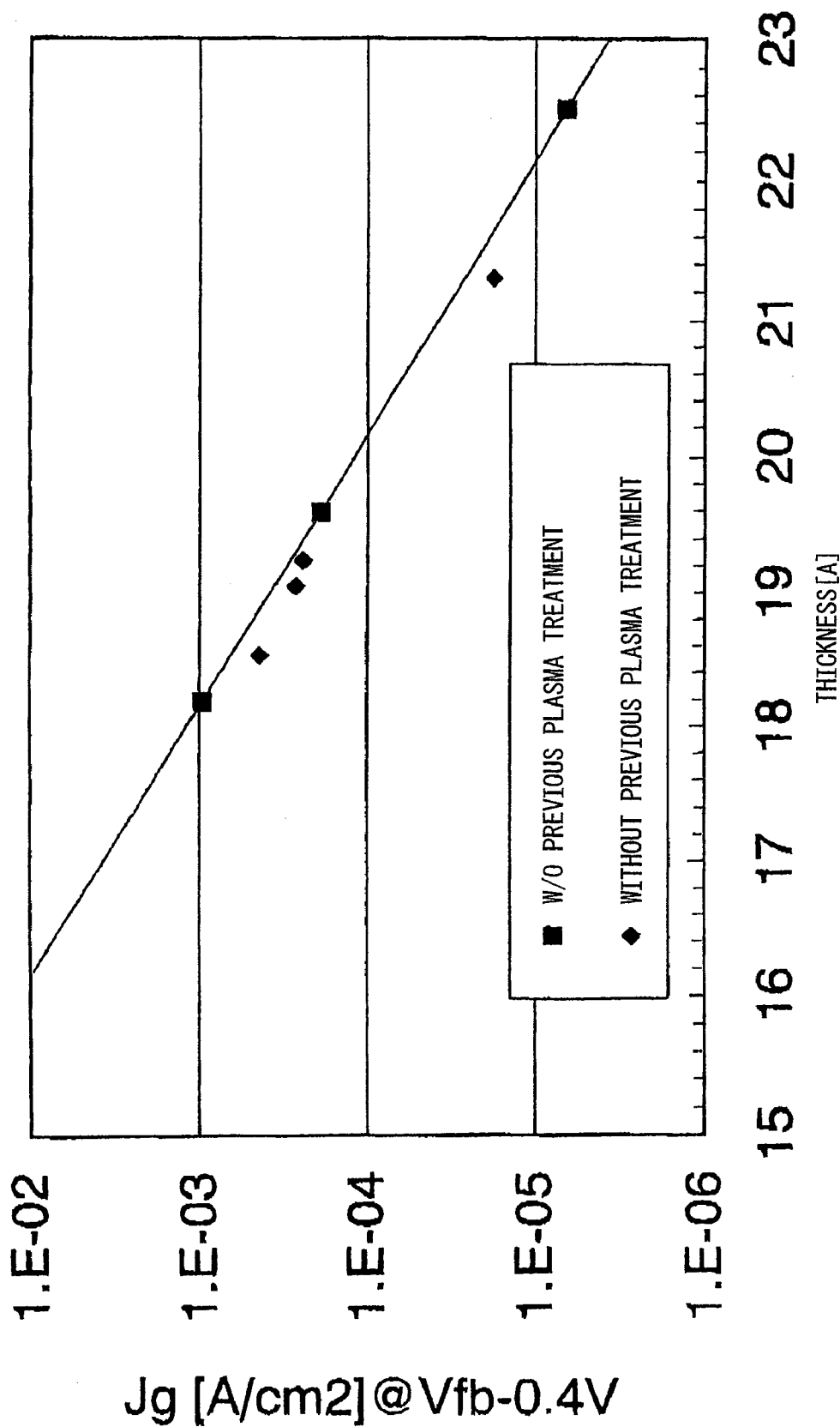
FIG. 5 is a graph showing a leakage characteristic of an oxide film in a case where the oxide film has been subjected to a pre-oxidation plasma treatment, and the oxide film has not been subjected to a pre-oxidation plasma treatment. In this figure, the abscissa denotes the electrical film thickness and the ordinate denotes the leakage current value for the gate oxide film at a gate voltage Vfb−0.4 V.

FIG. 5 is a diagram showing a comparison of leakage characteristic of an oxide film subjected to previous plasma treatment with leakage characteristic of an oxide film not subjected to previous plasma treatment. In this connection, it should be noted that, for illustrating only the effect of the previous plasma treatment, the oxide film used here have not been subjected to nitriding and post-hydrogen treatment. The electrical film thickness determined from the CV characteristic is plotted as abscissa against leakage current value at a gate voltage Vfb–0.4 V (about −1.2 V because Vfb is about −0.8 V) as ordinate. As can be seen from FIG. 5, the previous plasma treatment could reduce the leakage current value of the oxide film.

Figure 6:
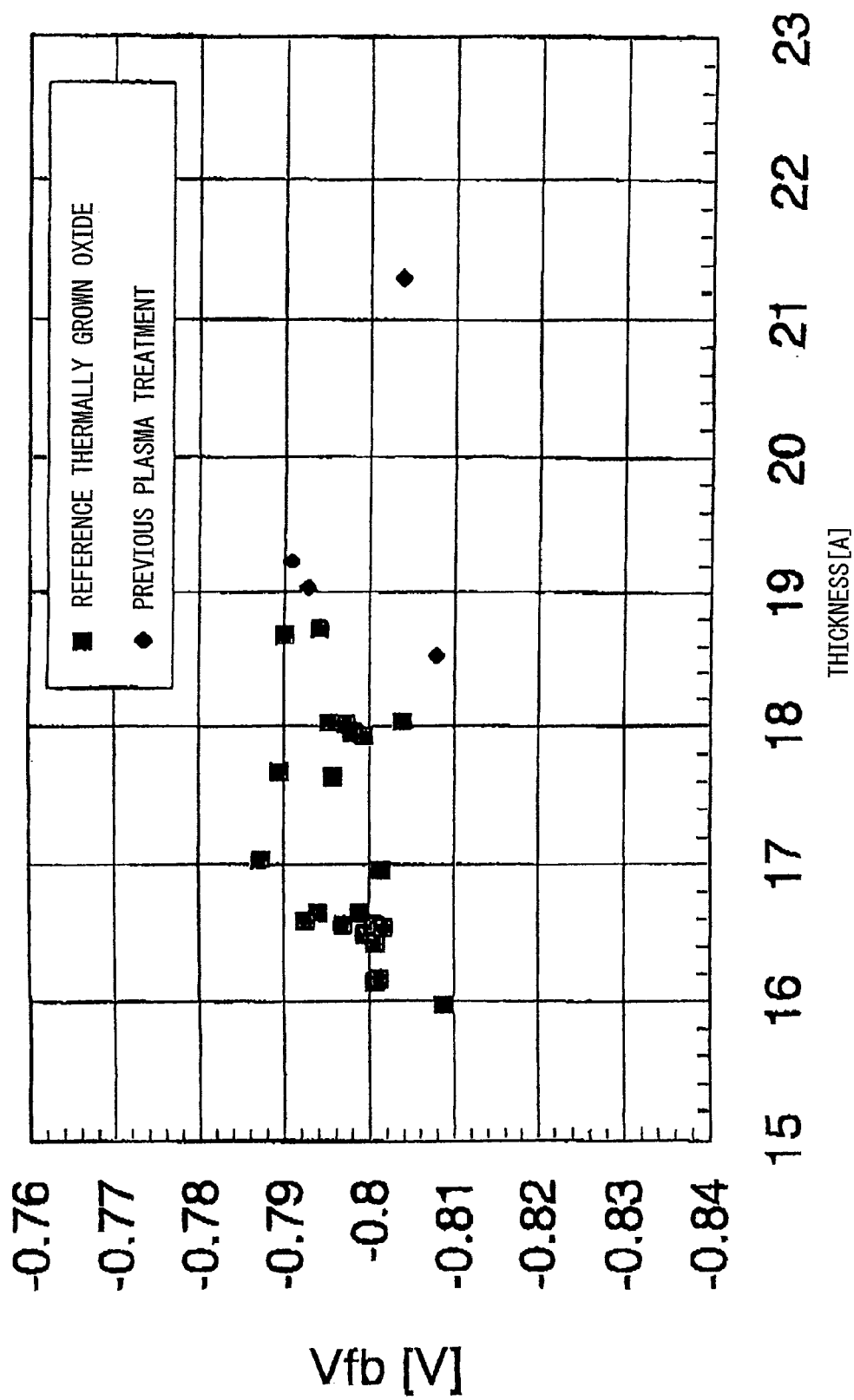
FIG. 6 is a diagram showing a flatband characteristic of a similar film. In this figure, the abscissa denotes the electrical film thickness and the ordinate denotes the flatband voltage.

FIG. 6 is a diagram showing a comparison of flatband characteristic of RLSA plasma an oxide film subjected to previous plasma treatment with flatband. characteristic of thermally grown an oxide film currently commonly used in devices. The electrical film thickness determined from the CV characteristic is plotted as abscissa against flatband voltage determined from the CV characteristic as ordinate. It is known that, when defects and the like, which serve as traps of carriers, are present in the film and interface, the flatband voltage is greatly shifted in a negative direction. However, for the film subjected to previous plasma treatment, the flatband value was similar to that of the thermally grown oxide film (about −0.8 V), and a deterioration in flatband characteristic in this step was not observed.

Figure 7A:
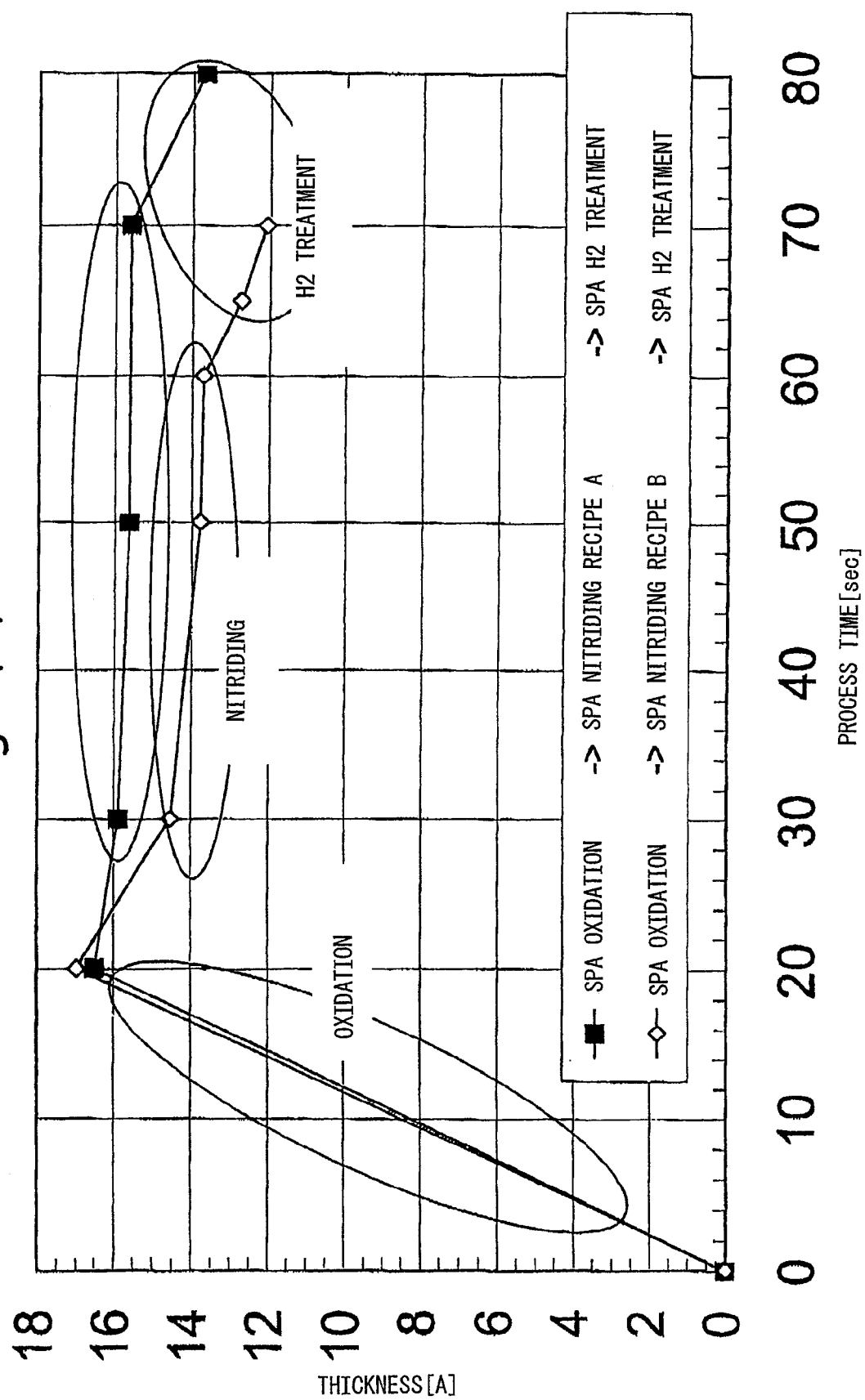
FIG. 7a is a diagram showing a change in the electrical film thickness of a gate oxynitride film using a plurality of steps (multi-process) in the present invention with the elapse of time (i.e., a change in the electrical film thickness in each step). In this figure, the abscissa denotes the treatment time, and the ordinate denotes the electrical film thickness.

FIG. 7a shows a change in the electrical film thickness of gate oxynitride film using a plurality of steps (multi-process) in the present invention with the elapse of time (a change in the electrical film thickness for each step). The process time is plotted as abscissa against electrical film thickness as ordinate. The electrical film thickness could be successfully reduced by 1 to 3.5 A by nitriding. Further, a further film thickness reduction could be realized by post-hydrogen treatment.

FIG. 7b is a diagram showing a change in flatband voltage of the same film as shown in FIG. 9 with the elapse of time (a change in flatband voltage for each step). The process time is plotted as abscissa against flatband voltage as ordinate. It is known that, when defects and the like, which serve as traps of carriers, are present in the film and interface, the flatband voltage is greatly shifted in a negative direction. However, for the film subjected to post-plasma hydrogen treatment, recovery of the flatband shift is observed, indicating that the film characteristic deteriorated by nitriding could be recovered.

Figure 8:
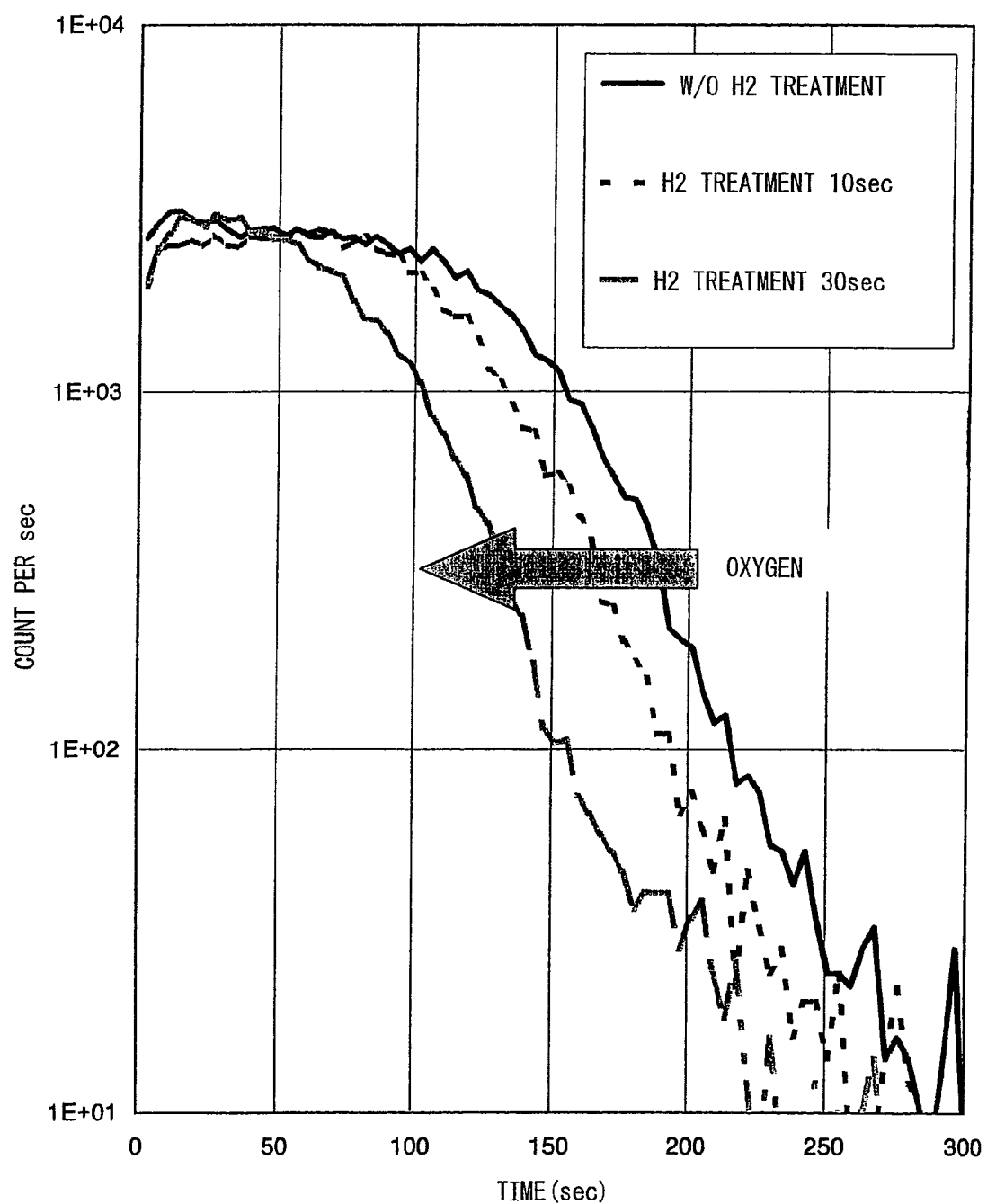
FIG. 8 is a diagram showing the results of SIMS analysis for the concentration of oxygen in a film similar to that of FIG. 6, In this figure, the abscissa denotes the etching time in the analysis, and the ordinate denotes the oxygen signal intensity.

As can be seen from FIG. 8, upon hydrogen treatment, the film thickness (the thickness of the oxygen-containing layer) is reduced. This is attributable to reduction by a hydrogen reaction species. Control (etching) of a film thickness reduction in a region where the control of film thickness reduction is difficult (around 10 A) can be realized by effectively utilizing this step.

As can be seen from FIGS. 7a and 7b, according to the present invention, a plurality of steps can be successively carried out in a reaction chamber under the same principle while avoiding the exposure of a silicon substrate to the air. For example, a reduction in footprint can be realized by conducting all steps in a single reaction chamber. Further, also when the individual steps are carried out in respective separate reaction chambers, since reaction chambers identical to each other in principle of operation are arranged, identical gas piping and operation panel can be used, leading to the realization of excellent maintenance and operationality. Further, since identical apparatuses are used, there is no significant fear of cross-contamination between the apparatuses. Even when a cluster construction using a plurality of reaction chambers is adopted, the processing order can be varied. Gate insulating film having various characteristic can be prepared by this method.

Further, in the above example, the oxynitride film prepared according to the present invention as such is used as a gate insulating film. Alternatively, a process may be adopted which comprises forming a very thin (about 10 A (angstroms)) oxynitride film according to the present invention and forming thereon a film of a material a having high dielectric constant such as a high-k material. According to this method, a stacked gate insulating film structure (gate stack structure) having a higher level of interfacial characteristic, for example, a higher level of transistor carrier mobility, than a gate insulating film formed using a high-k material only.

Example 3

The production process of a logic device in this embodiment is roughly carried out in the following order: "element isolation R preparation of MOS transistor R capacitance preparation R formation of interlayer insulating film and wiring".

Among steps before the preparation of an MOS transistor including the process according to the present invention, particularly the preparation of an MOS structure deeply associated with the present invention will be explained through a typical example.

(1): Substrate

A P-type or N-type silicon substrate having a specific resistance of 1 to 30 Ωcm and plane orientation (100) is used as a substrate. A process for the preparation of an NHOS transistor using a P-type silicon substrate will be explained.

A step of element isolation such as STI or LOCOS and channel implantation have been carried out on the silicon substrate according to the purpose, and the surface of the silicon substrate, on which a gate oxide film and a gate insulating film are to be formed, has a sacrificial oxide film thereon (FIG. 9).

(2): Cleaning Before Gate Oxide Film (Gate Insulating Film) Formation

In general, the sacrificial oxide film and contamination elements (metals and organic matter, particles) are removed by RCA cleaning using a combination of APM (a mixed liquid composed of ammonia, aqueous hydrogen peroxide, and pure water) with HPM (a mixed liquid composed of hydrochloric acid, aqueous hydrogen peroxide, and pure water) and DHF (a mixed liquid composed of hydrofluoric acid and pure water). As desired, SPM (a mixed liquid composed of sulfuric acid and aqueous hydrogen peroxide), aqueous ozone, FPM (a mixed liquid composed of hydrofluoric acid, aqueous hydrogen peroxide, and pure water), aqueous hydrochloric acid (a mixed liquid composed of hydrochloric acid and pure water), and organic alkalis and the like are sometimes used.

(3): Plasma Treatment Before Base Oxidation

After the treatment in the step (2), RLSA plasma treatment is carried out on the substrate as a step before base oxide film formation. Possible treatment conditions may be, for example, as follows. A wafer is transferred to a vacuum (back pressure: not more than $1 \times 10^{-4}$ Pa) reaction chamber 32, and conditions of substrate temperature 400° C., rare gas (for example, Ar gas) 1000 sccm, and pressure 7 Pa to 133 Pa (50 mTorr to 1000 mTorr) are then held. A microwave is applied at 2 to 3 W/cm$^2$ to this atmosphere through a plane antenna member (RLSA) having a plurality of slots to generate rare gas plasma for plasma treatment on the substrate surface. As desired, hydrogen (5 to 30 sccm) may be contained in the mixed gas for hydrogen pre-oxidation plasma treatment (FIG. 10).

(4): Formation of Base Oxide Film

An oxide film is formed by the following method on the silicon substrate treated in the step (3). While avoiding the exposure of the silicon substrate treated in the step (3) to the air, the silicon substrate is subjected to treatment by the following process (for example, treatment in an identical reaction chamber 32). According to this method, oxidation treatment can be carried out while optimally maintaining the organic contaminant removing effect and the spontaneous oxide film removing effect attained by the treatment in the step (3). More specifically, rare gas and oxygen are allowed to flow respectively at 1000 to 2000 sccm and 50 to 500 sccm over the silicon substrate heated at 400° C., and the pressure is held at 13 Pa to 133 Pa (100 mTorr to 1000 mTorr). A microwave is applied at 2 to 3 W/cm$^2$ to this atmosphere through a plane antenna member (RLSA) having a plurality of slots to generate plasma containing oxygen and rare gas, and this plasma is used for the formation of an SiO$_2$ film on the substrate treated in the step (3). Further, the film thickness can be regulated by varying treatment conditions including treatment (process) time (FIG. 11).

(5): Plasma Nitriding Process

Nitriding is carried out by the following method on the oxide film formed in the step (4). While avoiding the exposure of the oxide film formed in the step (4) to the air, the oxide film is subjected to treatment by the following process (for example, treatment in an identical reaction chamber 32, or treatment using a vacuum transfer system in other reaction chamber 33 while avoiding exposure to the air). According to this method, nitriding treatment can be carried out while suppressing organic matter contamination and an increase in spontaneous oxide film on the upper part of the oxide film formed in the treatment in the step (4). More specifically, rare gas and nitrogen are allowed to flow respectively at 500 to 2000 sccm and 4 to 500 sccm over the silicon substrate heated at 400° C., and the pressure is held at 3 Pa to 133 Pa (20 mTorr to 1000 mTorr). A microwave is applied at 2 to 3 W/cm$^2$ to this atmosphere through a plane antenna member (RLSA) having a plurality of slots to generate plasma containing nitrogen and rare gas, and this plasma is used for the formation of an oxynitride film (SiON film) on the substrate (FIG. 11).

(6): Film Thickness Reduction and Recovery of Vfb Shift by Hydrogen Plasma

Annealing treatment with hydrogen plasma is carried out on the oxynitride film formed in the treatment in the step (5) by the following method. While avoiding the exposure of the oxynitride film formed in the treatment in the step (5) to the air, the oxynitride film is subjected to treatment by the following process (for example, treatment in an identical reaction chamber 32, or treatment using a vacuum transfer system in other reaction chamber 33 while avoiding exposure to the air). According to this method, hydrogen plasma annealing treatment can be carried out while suppressing organic matter contamination and an increase in spontaneous oxide film on the upper part of the oxynitride film formed in the treatment in the step (5). More specifically, rare gas and hydrogen are allowed to flow respectively at 500 to 2000 sccm and 4 to 500 sccm over the silicon substrate heated at 400° C., and the pressure is held at 3 Pa to 133 Pa (20 mTorr to 1000 mTorr). A microwave was applied at 2 to 3 W/cm$^2$ to this atmosphere through a plane antenna member (RLSA) having a plurality of slots to generate plasma containing hydrogen and rare gas, and this plasma is used for hydrogen plasma annealing treatment on the oxynitride film (FIG. 11).

(7): Formation of High-k Gate Insulating Film

Figure 12:
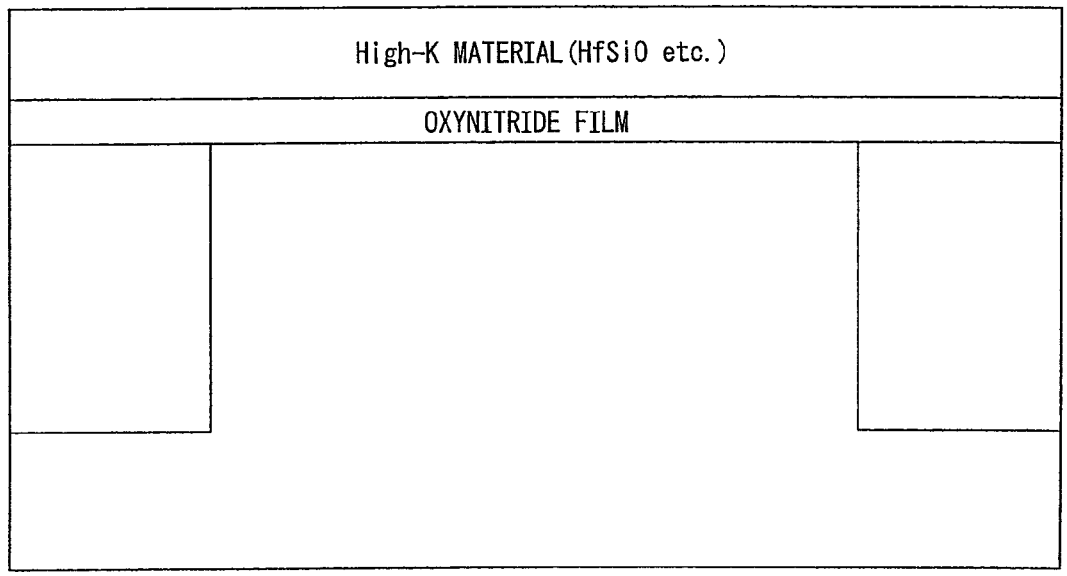
FIG. 12 is a schematic sectional view showing one embodiment of the formation of a film using a Hi-k material.

A film of a high-k material is formed on the base oxynitride film formed in the step (6). Methods for high-k gate insulating film formation are classified roughly into a process using CVD and a process using PVD. Here the formation of a gate insulating film by CVD will be mainly described. In the formation of a gate insulating film by CVD, raw material gases (for example, HTB: Hf (OC$_2$H$_5$)$_4$ and SiH$_4$) are supplied onto the above silicon substrate heated at a temperature falling within the range of 200° C. to 1000° C., and thermally produced reaction species (for example, Hf radicals, Si radicals, and 0 radicals) are allowed to react with each other on the surface of the film and consequently to form a film (for example, HfSiO). The reaction species are sometimes produced by plasma. The physical film thickness of the gate insulating film may generally be 1 nm to 10 nm (FIG. 12).

(8): Formation of Polysilicon Film for Gate Electrode

Figure 13:
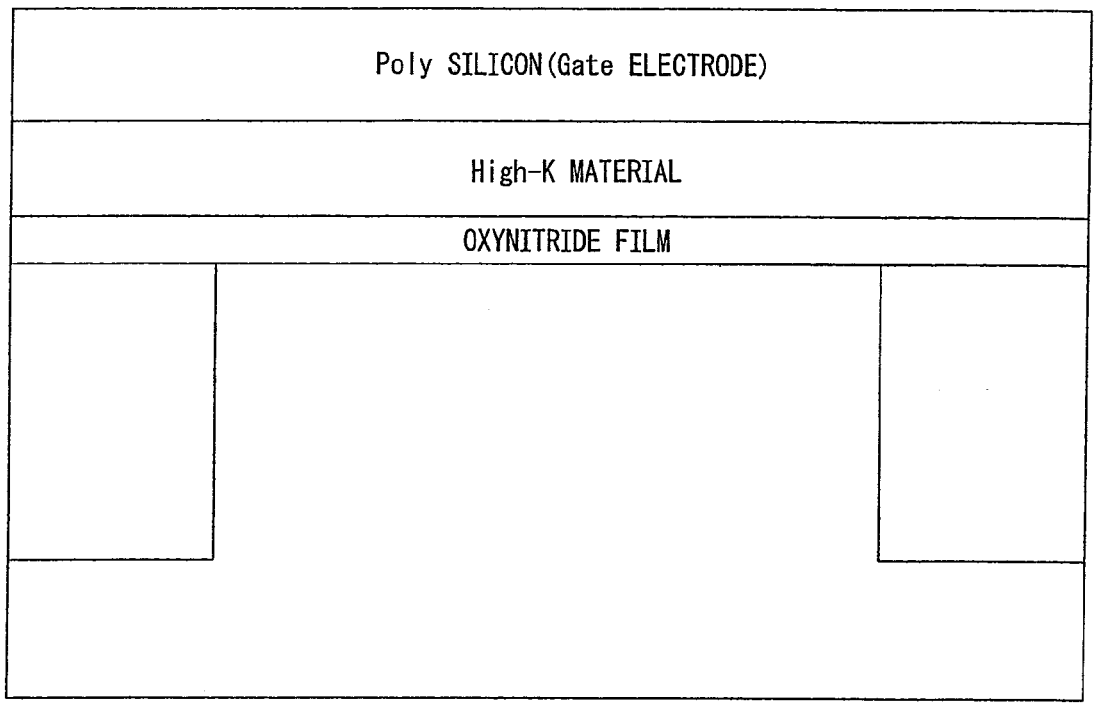
FIG. 13 is a schematic sectional view showing one embodiment of the formation of a gate electrode on a Hi-k material film.

A film of polysilicon (including amorphous silicon) is formed, as a gate electrode for an MOS transistor, by CVD on the high-k gate insulating film (including the base gate oxide film) formed in the step (7). The silicon substrate with the gate insulating film formed thereon is heated to a temperature falling within the range of 500° C. to 650° C., and a silicon-containing gas (for example, silane, disilane, etc.) is supplied over the substrate under a pressure of 10 to 100 Pa to form a 50 nm to 500 nm-thick polysilicon film for an electrode on the gate insulating film. In the gate electrode, silicon germanium and metals (for example, W (tungsten), Ru (ruthenium), TiN (titanium nitride), Ta (tantalum), and Mo (molybdenum)) are sometimes used as an alternative to polysilicon (FIG. 13).

Figure 14:
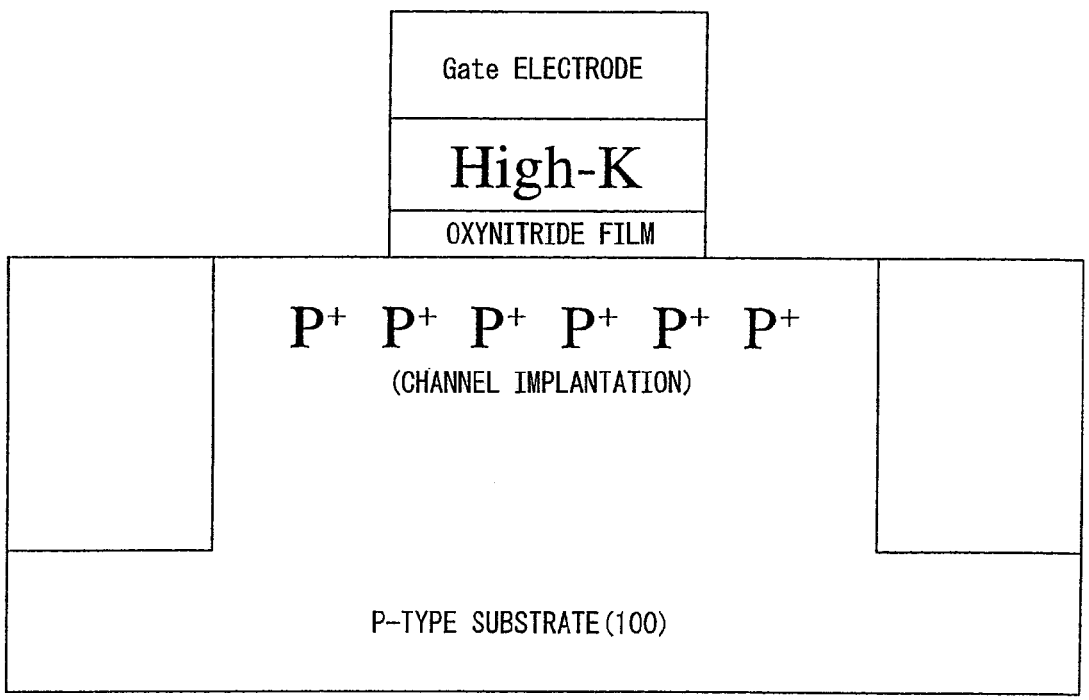
FIG. 14 is a schematic sectional view showing one embodiment of the formation of an MOS capacitor.
Figure 15:
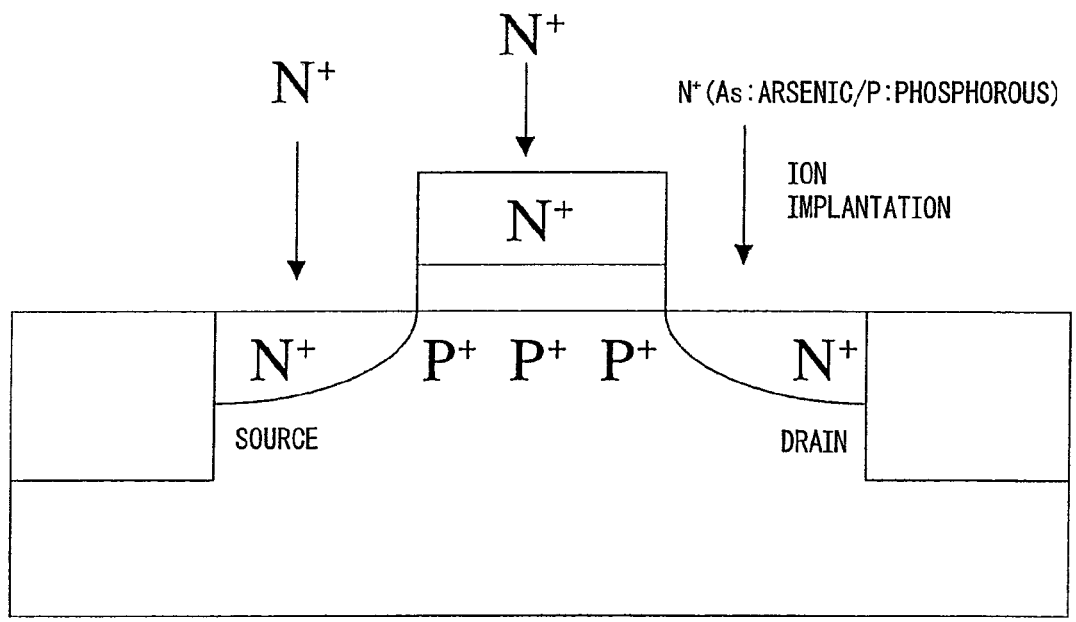
FIG. 15 is a schematic sectional view showing one embodiment of the formation of a source and a drain by ion implantation.
Figure 16:
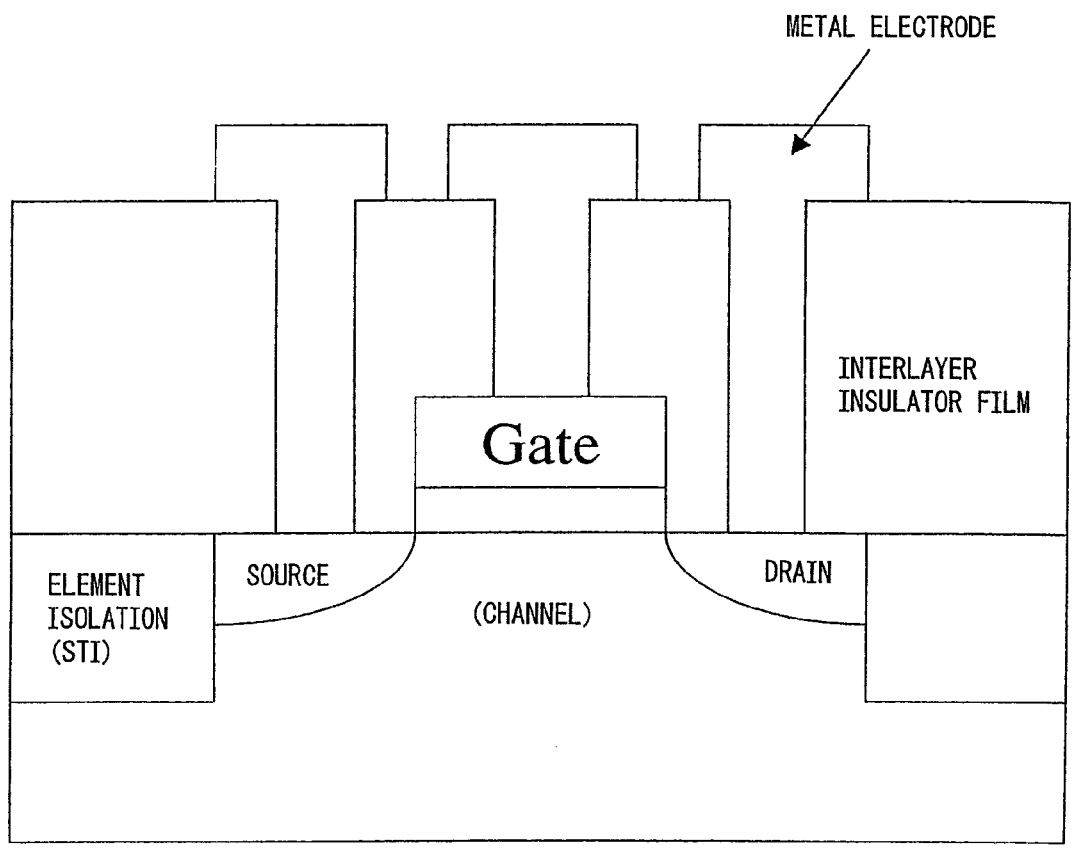
FIG. 16 is a schematic sectional view showing one embodiment of an MOS transistor structure provided by the present invention.

Thereafter, patterning of the gate and selective etching are carried out to form an MOS capacitor (FIG. 14), and ion implantation is carried out to form a source and a drain (FIG. 15). Thereafter, annealing is carried out to activate the dopant (phosphorus (P), .arsenic (As), boron (B) or the like implanted into the channel, the source, and the drain). Subsequently, a step of wiring by combining formation of an interlayer insulating film, patterning, selective etching, and formation of a metal film is carried out as a post-process to prepare an MOS transistor involved in this embodiment (FIG. 16). Finally, a step of wiring is carried out on the. upper part of the transistor in various patterns to prepare a circuit and thus to complete a logic device.

In this Example, a film of Hf silicate (HfSiO film) was formed as the insulating film. However, an insulating film having other composition may also be formed. The gate insulating film may be one or at least two film selected from the group consisting of film of conventional low-dielectric constant $SiO_2$ and SiON, and relatively high-dielectric constant SiN, high-dielectric constant $Al_2O_3$, $ZrO_2$, $HfO_2$, and $Ta_2O_5$ called high-k materials, and silicates such as ZrSiO and HfSiO and aluminates such as ZrAlO.

Further, in this Example, the formation of a base gate oxynitride film is intended. Alternatively, the base gate oxynitride film as such may be used as the gate insulating film without the formation of a film of a high-k material. In this case, the thickness of the base oxide film should be regulated.

Furthermore, an oxide film not subjected to nitriding may also be used as the base film, and the oxide film per se may also be used as the gate insulating film.

Further, as desired, the treatment before oxidation and the post-hydrogen treatment may also be omitted, and the order of treatment may also be changed.

Examples of the order of treatment according to the purposes are as follows.

1: Formation of Gate Oxide Film
Treatment before oxidation→oxidation treatment→formation of poly film 2: Formation of Gate Oxynitride Film-1
Treatment before oxidation→oxidation treatment→nitriding→post-hydrogen treatment→formation of poly film 3: Formation of Gate Oxynitride Film-2
Treatment before oxidation→nitriding oxidation treatment→post-hydrogen treatment→formation of poly film 4: Formation of High-k Base Oxide Film
Treatment before oxidation→oxidation treatment→film thickness reduction by post-hydrogen treatment→formation of high-k film→formation of poly film 5: Formation of High-k Base Nitride Film
Treatment before nitriding (same as treatment before oxidation)→nitriding→post-hydrogen treatment→formation of high-k film→formation of poly film The above embodiments are merely examples of embodiments of the present invention. In addition to the above embodiments, other various treatment methods can be carried out in an identical apparatus construction.

As described above, according to the present invention, a plurality of steps can be successively carried out in a reaction chamber(s) under the same principle while avoiding the exposure of a silicon substrate to the air. For example, a reduction in footprint can be realized by conducting a plurality of steps of cleaning, oxidation, nitriding, and etching in a single reaction chamber. Further, also when the individual steps are carried out in respective separate reaction chambers, since reaction chambers identical to each other in principle of operation are arranged, identical gas piping and operation panel can be used, leading to the realization of excellent maintenance and operationality. Further, since identical apparatuses are used, there is no significant fear of cross-contamination between the apparatuses. Even when a cluster construction using a plurality of reaction chambers is adopted, the processing order can be varied. Gate insulating film having various characteristic can be prepared by this method.

INDUSTRIAL APPLICABILITY

As described above, according to the present invention, an insulating film having various excellent characteristic (for example, control of very small film thickness and a high level of cleanness) can be produced with a high efficiency (for example, small footprint provided by conducting a plurality of steps of cleaning, oxidation, nitriding, and etching in a single reaction chamber, or simplification of operationality and prevention of cross-contamination between apparatuses realized by conducting various steps in reaction chambers under the same principle of operation).

The invention claimed is:

1. A process for forming an insulating film on the surface of a substrate for an electronic device, comprising the steps of:
   cleaning the substrate with plasma based on a cleaning gas comprising a rare gas;
   oxidizing the substrate with plasma based on an oxidizing gas comprising a rare gas and oxygen, to thereby form an oxide film thereon;
   treating the oxide film with plasma based on a treating gas comprising hydrogen gas after the oxidizing to recover defects in the oxide film; and
   forming a High-k film on the oxide film after the treating;
   wherein the cleaning and oxidizing are conducted under the same operation principle; and
   the cleaning and oxidizing are conducted in the same vessel without exposure of the substrate to air.

2. A process for forming an insulating film according to claim 1, wherein the substrate is subjected to wet cleaning prior to the cleaning with plasma.

3. A process for forming an insulating film according to claim 1, wherein the High-k film comprises one material selected from the group consisting of $Al_2O_3$, $ZrO_2$, $HfO_2$, and $Ta_2O_5$, ZrSiO, HfSiO and ZrAlO.

4. A process for forming an insulating film on the surface of a substrate for an electronic device, comprising the steps of:
   cleaning the substrate with plasma based on a cleaning gas comprising a rare gas;
   nitriding the substrate with plasma based on a nitriding gas comprising a rare gas and nitrogen, to thereby form an nitride film thereon;
   treating the nitride film with plasma based on a treating gas comprising hydrogen gas after the nitriding; and
   forming a High-k film on the nitride film after the treating;
   wherein the cleaning and nitriding are conducted under the same operation principle; and
   the cleaning and nitriding are conducted in the same vessel without exposure of the substrate to air.

5. A process for forming an insulating film according to claim 4, wherein the substrate is subjected to wet cleaning prior to the cleaning with plasma.

6. A process for forming an insulating film according to claim 4, wherein the High-k film comprises one material selected from the group consisting of $Al_2O_3$, $ZrO_2$, $HfO_2$, and $Ta_2O_5$, ZrSiO, HfSiO and ZrAlO.

7. A process for forming an insulating film according to claim 1, wherein the treating gas consists of rare gas and hydrogen.

8. A process for forming an insulating film according to claim 4, wherein the treating gas consists of rare gas and hydrogen.

* * * * *